United States Patent
Gonzales et al.

(10) Patent No.: US 9,260,015 B2
(45) Date of Patent: Feb. 16, 2016

(54) METHOD AND SYSTEM FOR CONTACTOR WELD DETECTION

(71) Applicant: Ford Global Technologies, LLC, Dearborn, MI (US)

(72) Inventors: Philip Michael Gonzales, Dearborn, MI (US); Debbi Callicoat, Livonia, MI (US); Masahiro Kimoto, Plymouth, MI (US); Benjamin A. Tabatowski-Bush, South Lyon, MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 67 days.

(21) Appl. No.: 14/150,872

(22) Filed: Jan. 9, 2014

(65) Prior Publication Data

US 2015/0191088 A1   Jul. 9, 2015

(51) Int. Cl.
*B60L 3/12* (2006.01)
*G07C 5/08* (2006.01)
*G01R 31/327* (2006.01)

(52) U.S. Cl.
CPC .............. *B60L 3/12* (2013.01); *G01R 31/3278* (2013.01); *G07C 5/0808* (2013.01); *Y10S 903/907* (2013.01)

(58) Field of Classification Search
CPC .... B60L 3/12; G07C 5/0808; G01R 31/3278; Y10S 903/907
USPC ......................................................... 701/342
See application file for complete search history.

(56) References Cited

U.S. PATENT DOCUMENTS

| | | |
|---|---|---|
| 2009/0228163 A1 | 9/2009 | Tarchinski |
| 2010/0250194 A1 | 9/2010 | Newhouse et al. |
| 2012/0105065 A1 | 5/2012 | Namou et al. |
| 2013/0221743 A1 | 8/2013 | Grupido |
| 2015/0115966 A1* | 4/2015 | Berman et al. ................. 324/418 |

FOREIGN PATENT DOCUMENTS

WO      2013033454         3/2013

OTHER PUBLICATIONS

Chrylser Group LLC; Overview of Battery Management System—A Controls Engineering Perspective; Sep. 26, 2012; pp. 1-19.

* cited by examiner

*Primary Examiner* — Richard Camby
(74) *Attorney, Agent, or Firm* — Carlson, Gaskey & Olds, P.C.

(57) ABSTRACT

An example contactor weld detection method for an electric vehicle includes detecting that a contactor is welded closed when the contactor is commanded closed.

19 Claims, 3 Drawing Sheets

METHOD AND SYSTEM FOR CONTACTOR WELD DETECTION

BACKGROUND

This disclosure relates to detecting welded contactors in electric vehicles.

Generally, electric vehicles differ from conventional motor vehicles because electric vehicles are selectively driven using one or more battery-powered electric machines. Conventional motor vehicles, by contrast, rely exclusively on an internal combustion engine to drive the vehicle. Electric vehicles may use electric machines instead of, or in addition to, the internal combustion engine.

Example electric vehicles include hybrid electric vehicles (HEVs), plug-in hybrid electric vehicles (PHEVs), fuel cell vehicles, and battery electric vehicles (BEVs). A powertrain of an electric vehicle is typically equipped with a battery that stores electrical power for powering the electric machine. The battery may be charged prior to use. The battery may be recharged during a drive by regeneration braking or an internal combustion engine.

The powertrain of the electric vehicle includes contactors (or relays). During a drive cycle, the contactors close to electrically couple the battery with other areas of the powertrain. When the drive cycle is complete, the contactors open to, for example, protect a technician servicing the vehicle. If the contactor is welded closed, the contactor does not open and the circuit may remain open. Prior art techniques identify welds at key off at the completion of a drive cycle.

SUMMARY

A contactor weld detection method for an electric vehicle according to an exemplary aspect of the present disclosure includes, among other things, detecting that a contactor is welded closed when the contactor is commanded closed.

In a further non-limiting embodiment of the foregoing method, the detecting occurs without commanding the contactor to open.

In a further non-limiting embodiment of any of the foregoing methods, the detecting is during operation of the vehicle.

In a further non-limiting embodiment of any of the foregoing methods, the method includes communicating current through the contactor during the detecting.

In a further non-limiting embodiment of any of the foregoing methods, the method includes alerting in response to the detecting.

In a further non-limiting embodiment of any of the foregoing methods, the method includes measuring a resistance during the detecting.

In a further non-limiting embodiment of any of the foregoing methods, the method includes comparing the resistance from the measuring to another resistance to detect that the contactor is welded.

In a further non-limiting embodiment of any of the foregoing methods, the method includes issuing an alert that the contactor is welded when the difference between measured resistance and the other resistance is greater than a threshold value.

In a further non-limiting embodiment of any of the foregoing methods, the contactor is welded closed when a contact of the contactor is welded to another contact of the contactor.

A weld detection method for a contactor of an electric vehicle according to another exemplary aspect of the present disclosure includes, among other things, communicating current through a contactor to a portion of an electric vehicle, and detecting, during the communicating, that the contactor is welded closed.

In a further non-limiting embodiment of the foregoing method, the method includes communicating current from the contactor to a bus or a battery.

In a further non-limiting embodiment of any of the foregoing methods, the contactor is welded closed when a contact of the contactor is welded to another contact of the contactor.

A contactor weld detection system according to yet another exemplary aspect of the present disclosure includes, among other things, a contactor, and a controller of an electric vehicle. The controller is configured to selectively command the contactor to open and close. The controller is further configured to detect that the contactor is welded closed when the contactor is commanded closed.

In a further non-limiting embodiment the foregoing system, the controller is configured to detect that the contactor is welded closed without commanding the contactor to open.

In a further non-limiting embodiment of any of the foregoing systems, the system includes an operational amplifier coupled to the contactor to measure resistance across the contactor.

In a further non-limiting embodiment of any of the foregoing systems, the system includes a resistor in series with the contactor to measure resistance across the contactor.

In a further non-limiting embodiment of any of the foregoing systems, the system includes a contactor weld detection circuit to measure resistance across the contactor.

DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

Figure 1:
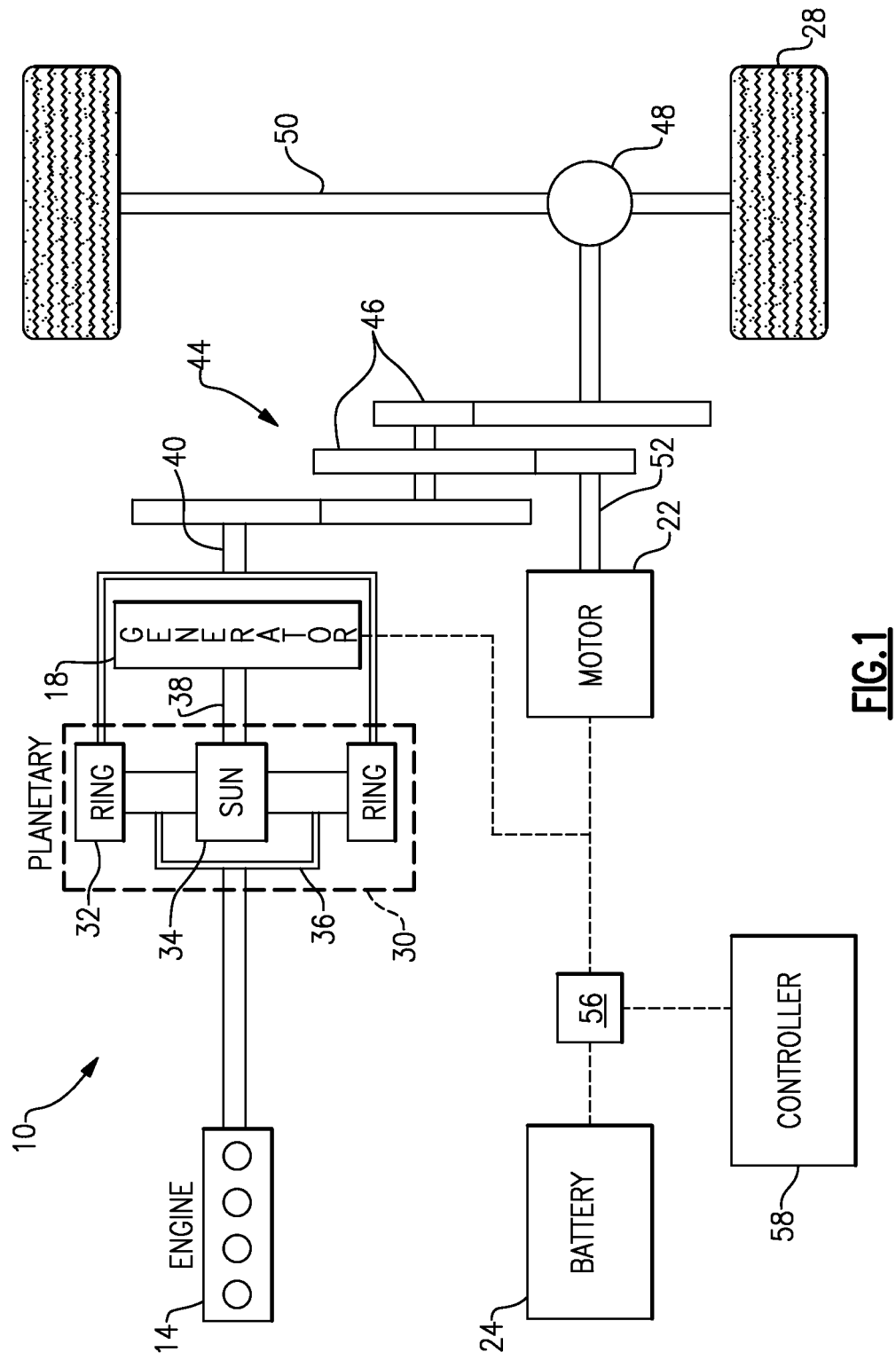
FIG. 1 illustrates a schematic view of a powertrain of an example electric vehicle.

FIG. 1 schematically illustrates a powertrain 10 for an electric vehicle. Although depicted as a hybrid electric vehicle (HEV), it should be understood that the concepts described herein are not limited to HEVs and could extend to other electrified vehicles, including, but not limited to, plug-in hybrid electric vehicles (PHEVs) and battery electric vehicles (BEVs).

In one embodiment, the powertrain 10 is a powersplit powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery 24. In this example, the second drive system is considered an electric drive system of the powertrain 10. The first and second drive systems generate torque to drive one or more sets of vehicle drive wheels 28 of the electric vehicle.

The engine 14, which is an internal combustion engine in this example, and the generator 18 may be connected through a power transfer unit 30, such as a planetary gear set. Of course, other types of power transfer units, including other gear sets and transmissions, may be used to connect the engine 14 to the generator 18. In one non-limiting embodiment, the power transfer unit 30 is a planetary gear set that includes a ring gear 32, a sun gear 34, and a carrier assembly 36.

The generator 18 can be driven by engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In this example, the second power transfer unit 44 is mechanically coupled to an axle 50 through the differential 48 to distribute torque to the vehicle drive wheels 28.

The motor 22 (i.e., the second electric machine) can also be employed to drive the vehicle drive wheels 28 by outputting torque to a shaft 52 that is also connected to the second power transfer unit 44. In one embodiment, the motor 22 and the generator 18 cooperate as part of a regenerative braking system in which both the motor 22 and the generator 18 can be employed as motors to output torque. For example, the motor 22 and the generator 18 can each output electrical power to the battery 24.

The battery 24 is an example type of electric vehicle battery assembly. The battery 24 may have the form of a high voltage battery that is capable of outputting electrical power to operate the motor 22 and the generator 18. Other types of energy storage devices and/or output devices can also be used with the electric vehicle having the powertrain 10.

The example powertrain 10 includes a contactor assembly 56 including one or more contactors that are selectively moved between an open position and a closed position. A controller 58, such as an engine control unit, is configured to open and close the contactors of the contactor assembly 56.

The contactors are typically closed during a drive cycle. Closing the contactors permits electrical power to circulate to and from the battery 24. At the conclusion of the drive cycle, when the powertrain 10 is not operating, the contactors are opened to protect against the relatively high voltage from the battery 24.

Figure 2:
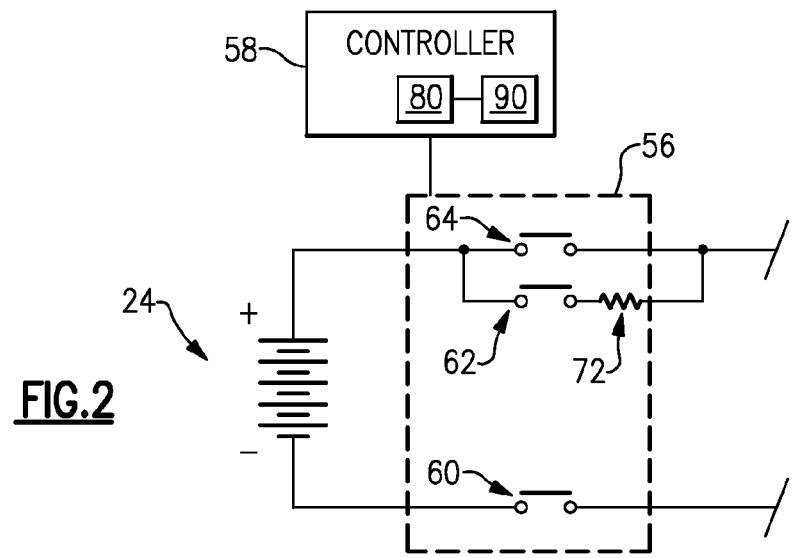
FIG. 2 shows a more detailed view of a contactor assembly of the powertrain of FIG. 1.

Referring to FIG. 2, the example contactor assembly 56 includes a first contactor 60, a second contactor 62, and a third contactor 64. The contactor assembly 56 electrically connects and disconnects the battery 24 from the remaining portions of the powertrain 10 (FIG. 1).

In this example, the first contactor 60 is associated with a negative terminal of the battery 24. The second contactor 62 and the third contactor 64 are associated with a positive terminal of the battery 24. The controller 58, which is an engine control unit in this example, commands the first contactor 60, second contactor 62, and third contactor 64 to open and close.

A drive cycle, generally, refers to when the powertrain 10 is operating. At the start of the drive cycle, the controller 58 commands the first contactor 60 and the second contactor 62 to close. A resistor 72 in line with the second contactor 62 protects the contactor assembly 56 from excessive inrush current at the start of the drive cycle.

The controller 58 next commands closed the third contactor 64, and commands open the second contactor 62 to allow free flow of current to and from the battery 24.

At the conclusion of the drive cycle, the controller 58 commands open the first contactor 60 and the third contactor 64. Opening the first contactor 60 and the third contactor 64 stops high voltage energy from the battery 24 from flowing to other areas of the powertrain 10. Opening the contactors 60, 62, 64, at the conclusion of a drive cycle may be required to meet regulatory requirements.

The contactor assembly 56 may further include additional contactors, such as precharge contactors, charge station contactors, etc. The controller 58 selectively activates the additional contactors to control current flow within the powertrain 10 when the powertrain 10 is operating.

As known, contactors that are closed may undesirably weld closed during operation. Commands from the controller 58 fail to open the contactors that have welded closed. In prior art designs, welded contactors are detected when the contactors are commanded open at the end of a drive cycle. For example, if a contactor fails to open after the controller 58 has commanded the contactor to open, that contactor may be considered to have welded.

Figure 3:
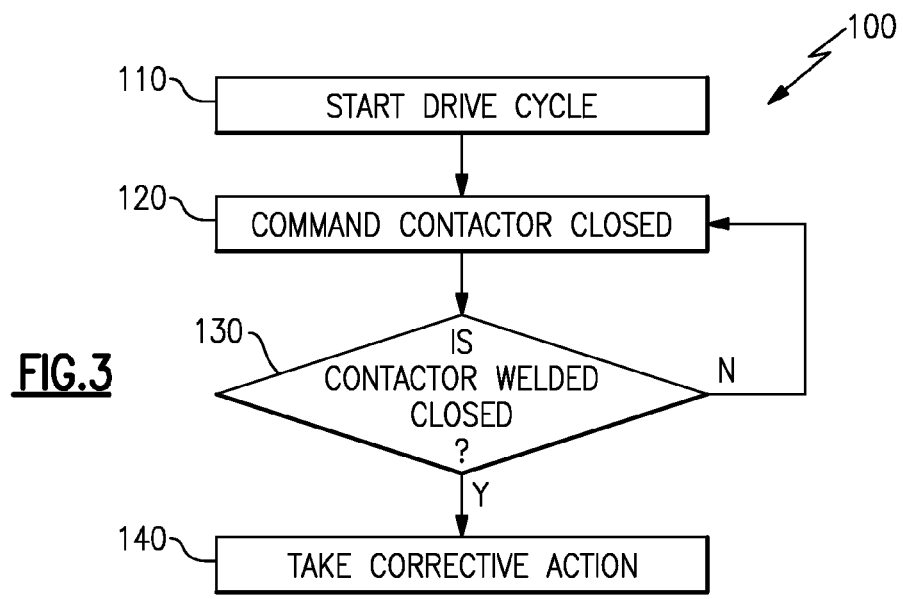
FIG. 3 shows the flow of an example contactor weld detection method.

Referring to FIG. 3, an example contactor weld detection method 100 includes starting a drive cycle at a step 110. At the start of the drive cycle, an engine control unit issues a command to close a contactor at a step 120. In this example, the contactor, which has closed, welds closed.

The method 100 detects that the contactor has welded closed at a step 130. Notably, the detecting occurs prior to commanding the contactor to open. That is, the detecting occurs when the contactor is commanded closed. Detecting that the contactor has welded closed prior to commanding the contactor to open provides detection of welded contactors earlier in a drive cycle than in the prior art.

Welded closed, in the context of this disclosure, can refer to a contactor fault condition occurring when contacts of the contactor have fully welded, partially welded, or both. When the contacts are fully welded, the resistance of the contactor can be lower than when the contacts are normally closed. If the contacts are partially welded, the resistance can be higher than when the contacts are normally closed. Thus, both a measured resistance that is lower than when the contactor is normally closed, and a measured resistance that is higher than when the contactor is normally closed may result in the method 100 indicating that the contactor has a fault condition resulting from welding. The method 100 may utilize a voltage divider configured to a resistive ratio corresponding to the resistance being lower or higher than when the contacts are normally closed.

At a step 140, the method takes corrective action in response to the contactor that has welded closed. Corrective action may include driving the vehicle to a service center. Corrective action could include the engine control unit initiating an alert, such as displaying a warning light to an operator of the vehicle.

Figures 4B, 4C:
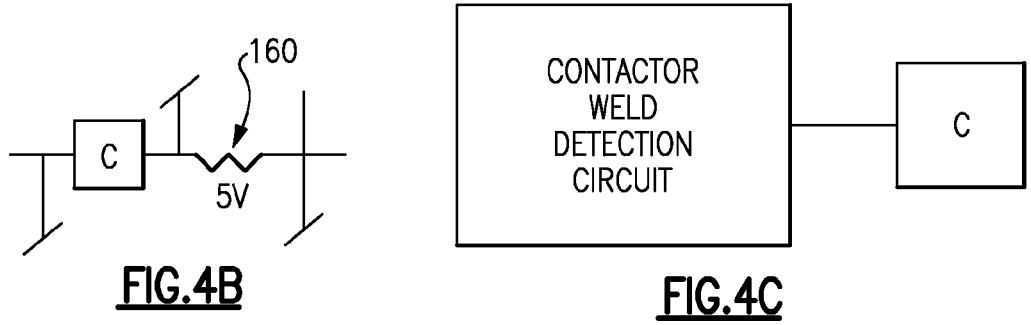
FIG. 4B shows a schematic view of a resistor used in an example of the method of FIG. 3.
FIG. 4C shows a schematic view of circuit used in an example of the method of FIG. 3.
Figure 4A:
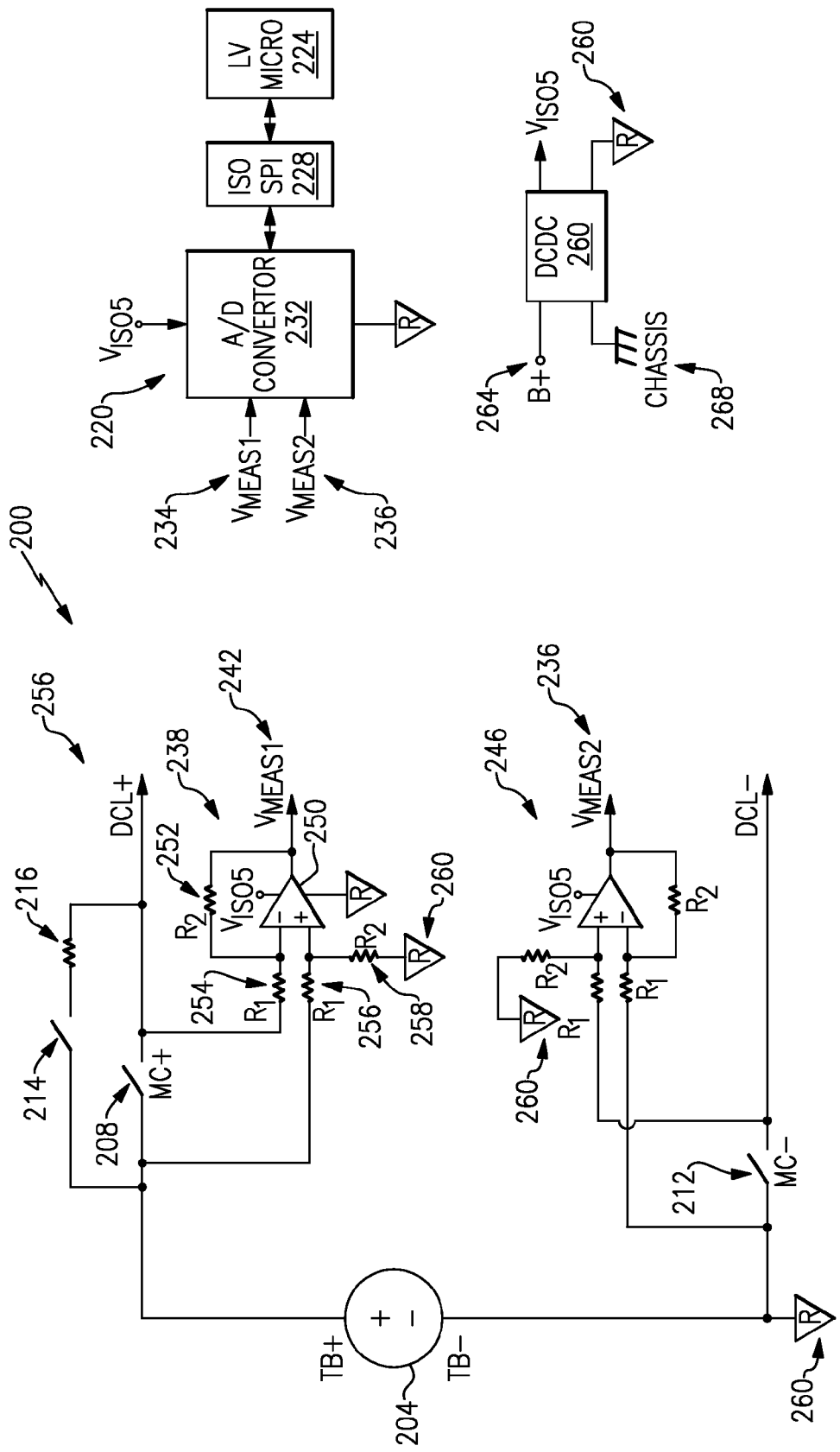
FIG. 4A shows example circuits used to measure voltage across the contactor assembly of FIG. 2.

The step 130 of detecting can involve measuring resistance across the contactor as current communicates through the contactor. FIGS. 4A-4C show example approaches to measuring resistance across the contactor.

Referring to the example of FIG. 4A with reference to FIGS. 1 to 3, an electrified battery pack circuit 200 could be used in a full hybrid electric vehicle, a plug-in hybrid electric vehicle, a battery electric vehicle, etc. Elements of the pack 200 include a cell string 204, a positive main contactor 208, a negative main contactor 212, a precharge contactor 214, and a precharge resistor 216.

An example Battery Energy Control Module (BECM) 220 includes a low voltage micro 210, an SPI Isolator 228, and high voltage A/D converter 232. The low voltage micro 210 is the main micro inside the BECM 220 in this example. The SPI Isolator 228 is configured to communicate a Serial Peripheral Interface (SPI) data stream from the LV Micro 210 into the High Voltage Domain. The converter 232 measures sensing voltages $V_{meas1}$ 234 and $V_{meas2}$ 236.

In this example, an amplifier 238 measures the resistance of positive main contactor 204. It does so by measuring the voltage drop across the positive main contactor 204 at a time when substantial current, for example 50 or 100 amps, is flowing through the positive main contactor. When a large current is flowing through the contactor 204, the signal to noise ratio for measuring the resistance of contactor 204 is improved. At this time, the example low voltage micro 224 runs software that continuously monitors the voltage across main contactor 208 via the amplifier 238. The low voltage micro 224 tracks the moments in time when the current through the main contactor 208 is high (for instance, 50 or 100 amps) and records the reading as $V_{meas1}$ 234. This reading of $V_{meas1}$ 234 is communicated to the A/D converter 232, through the isolated SPI interface 228, and is read by the micro 224.

Another amplifier 246 and the contactor 212 measure current in a manner similar to the amplifier 238.

The amplifier 246 includes a differential amplifier implemented with an opamp 250. A person having skill in this art and the benefit of this disclosure would be able to understand this implementation.

A feedback resistor 252 having a resistance R2 is used to close a feedback path from the opamp 250 output pin $V_{meas1}$ back to the (−) input of the opamp 252. This effectively results in a virtual short between the (−) and (+) pins of opamp 252, which is created by the action of the opamp 252 modulating its output voltage $V_{Vmeas1}$. The current through a resistor 254 having a resistance R1 and the feedback resistor 252 is set by the voltage difference between a DCL+ node 256 and the (−) terminal of opamp 250, divided by the resistance R1.

In this example, the voltage at both the (−) and (+) pins of opamp 250 is set by the voltage divider resistors 256 and 258 having resistances of R1 and R2 respectively. The reference voltage at the bottom of resistor 250 can be set by a R-reference 206. This is the same node voltage as the bottom of the cell string 204. The voltage on the (+) terminal of opamp 250 is set by the voltage on the cell string side of MC+ contactor 208, which is also the voltage applied to the left side of resistor 256. Notice that in most circumstances, the voltage of the cell string 204 is applied to the left side of resistor 256 and the bottom or (−) node of cell string 204 is applied to the bottom of resistor 258. Resistor 256 and resistor 258 form a resistive divider, so if the voltage of cell string 204 is consider the "Vpack" volts, then the voltage applied to the (+) pin of opamp 250 can be determined according to Equation 1.

$$V\text{-opamp}(+)\text{pin}=V\text{pack}*(R2/(R1*R2)) \quad \text{Equation (1)}$$

This voltage is with respect to the R-reference 202.

For the element values provided (resistor 254 and resistor 256 are R1 ohms, and resistor 215 and resistor 218 are R2 ohms,) then the equation for voltage Vmeas1 which is the output voltage of opamp 216, with respect to the R-reference 202 is provided by Equation (2).

$$V_{meas1}=(V2-V1)*R2/R1 \quad \text{Equation (2)}$$

In Equation (2), V2 is the voltage of the positive pin of cell string 204, and V1 is the voltage DCL+ 256.

Given the above, the gain of this circuit 200 is R2/R1, which is set to an appropriately large number. The ohmic impedance of MC+ 208 may be, for instance, 1 milliohm. At 100 amps of current through MC+, 0.001*100=100 mV. This 100 mV of reading is still very small to read into A/D converter 232. Therefore, if R2/R1 is set, for example, to 25 for a circuit gain of 25, then a 100 mV input signal into amplifier 238 will be amplified 25 times and a reading of 2.5V for $V_{meas1}$ 234 will be observed. If A/D 232 reads 2.5V on $V_{meas1}$ 234 at a time when 100 amps is flowing through MC+ 208, then the resistance of MC+ 208 is 1milliohm.

A circuit designer selecting R2 and R1 values can adjust these resistances as needed depending on the exact resistance value of contactor 208 and the current at which a reading is desired at through MC+ 208.

The same exposition can be made for amplifier 246 and the resistor values R1 and R2 used in Amplifier 246. In this case, the resistance of MC− 212 is measured via the voltage $V_{meas2}$ 236 coming from the opamp associated with the amplifier 212.

In this example, a DCDC 260 is used to provide the bias voltage $V_{iso5}$ This DCDC 260 is powered from the lead battery of the electric vehicle B+ 264 associated with the powertrain 10 (FIG. 1). B+ is the typical 12v power supply for the electric vehicle. The DCDC 260 draws power from a side B+ 264 with a chassis reference 268. On the other side, the DCDC 260 has an output reference as R-reference 260.

DCDC 260 is typically a galvanically isolated switching power supply to transfer power from input to output with no galvanic connection created between the input and output side. In this case, $V_{iso5}$ is some regulated supply voltage such as 5V, which powers A/D 232 and opamp 250.

Utilizing the circuits of FIG. 4A, the step 130 of detecting in the method 100 can include measuring the voltage across the positive main contactor 208 and the negative main contactor 212C during a start (or key run) of the powertrain 10. To identify if the contactor C is welded closed, the calculated resistance is compared to a reference resistance stored in, for example, a look-up table within an optional memory portion 80 of the controller 58. The comparison may occur within the controller, which may be a microprocessor controller.

The reference resistance may correspond to an expected resistance for the contactor C if the contactor C has not welded closed. For example, if the contactor C has 10,000 hours of use, a certain resistance may be expected. This expected resistance is stored in the look-up table as the reference resistance. If the calculated resistance varies from the reference resistance by a certain percentage, say from five to twenty-five percent, the contactor C is considered to have welded closed. The contactor C may also be considered to have welded closed based on a percentage change in resistance from the last calculated resistance. The look-up table may be populated with life cycle resistance data from bench tests from a supplier, for example.

Referring to FIG. 4B with continuing reference to FIGS. 1 to 3, in another example, to measure the resistance across the contactor C, the step 130 of detecting can include measuring the voltage across the contactor C during a start or key run of the powertrain. The voltage across the contactor C is measured using the opamp 250 (FIG. 4A) in a differential amplifier configuration whose input is the voltage across the contactor C. Using the $V_{meas1}$ 242 reading (FIG. 4A) and a measured current, the resistance across the contactor C can be ascertained.

Referring to FIG. 4C with continuing reference to FIGS. 1 to 3, in still other examples, the detecting utilizes software. For example, the voltage across the contactor C can be measured using an optional programmable contactor weld detection circuit 90 in the controller 58. When the powertrain 10 is operating, the circuit 90 measures voltage and current across the contactor C at or near the same time. The circuit 90 then measures resistance across the contactor C using the measured voltage and current. A person having skill in this art and the benefit of this disclosure would understand how to measure resistance across a contactor given measurements of voltage and current.

With a learning strategy, the circuit 90 is programmed to monitor changes in resistance across the contactor C. The changes may be changes in resistance from previous cycles, such as drive cycles, for example. The circuit 90 is further programmed to compare the measured resistance to the measured resistance from at least one previous cycle. The measured resistance from the at least one previous cycle can be stored in the memory portion 80.

A difference between the calculated resistance for a current cycle and the calculated resistance from at least one previous cycle is identified. If the difference is higher or lower than a defined threshold, the circuit 90 is programmed to issue an alert that the contactor C has welded.

In another example, the circuit 90 can be programmed to compare the measured resistance to life cycle data for contact resistance of a contactor over time.

Features of the disclosed examples include detecting a welded contactor relatively earlier during a drive cycle than in the prior art. Corrective action, such as driving the vehicle to a service location, can then take place earlier than in prior art designs.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

We claim:

1. A contactor weld detection method for an electric vehicle, comprising:
   commanding a contactor closed;
   closing the contactor in response to the commanding; and
   using an engine controller to detect that the contractor is welded closed when the contactor is both closed and commanded closed.

2. The method of claim 1, further comprising using the engine controller to detect that the contactor is welded closed without commanding the contactor to open.

3. The method of claim 1, further comprising using the engine controller to detect that the contactor is welded closed during operation of the vehicle.

4. The method of claim 1, communicating current through the contactor when using the engine controller to detect that the contactor is welded closed.

5. The method of claim 1, including alerting in response to the engine controller detecting that the contactor is welded closed.

6. The method of claim 1, including measuring a resistance when using the engine controller to detect that the contactor is welded closed.

7. The method of claim 6, comparing the resistance from the measuring to another resistance to detect that the contactor is welded.

8. The method of claim 7, including issuing an alert that the contactor is welded when the difference between measured resistance and the other resistance is greater than a threshold value.

9. The method of claim 1, wherein the contactor is welded closed when a contact of the contactor is welded to another contact of the contactor.

10. A weld detection method for a contactor of an electric vehicle, comprising:
    communicating current through a contactor to a portion of an electric vehicle; and
    using an engine controller to detect, during the communicating, that the contactor is welded closed, wherein the contactor is both closed and commanded closed during the communicating.

11. The method of claim 10, further comprising communicating current from the contactor to a bus or a battery.

12. The method of claim 10, wherein the contactor is welded closed when a contact of the contactor is welded to another contact of the contactor.

13. A contactor weld detection system, comprising:
    a contactor; and
    a controller of an electric vehicle, the controller configured to selectively command the contactor to open and close, the controller further configured to compare a calculated electrical parameter to a reference electrical parameter to detect that the contactor is welded closed when the contactor is commanded closed.

14. The system of claim 13, the controller is configured to detect that the contactor is welded closed without commanding the contactor to open.

15. The system of claim 13, including an operational amplifier coupled to the contactor to measure resistance across the contactor.

16. The system of claim 13, including a resistor in series with the contactor to measure resistance across the contactor.

17. The system of claim 13, including a contactor weld detection circuit to measure resistance across the contactor.

18. The method of claim 1, wherein the engine controller is contained within an electric vehicle.

19. The system of claim 13, wherein the controller is configured to detect that the contactor is welded closed when the contactor is both closed and commanded closed, and further wherein the controller is contained within the electric vehicle.

* * * * *